(12) United States Patent
Adkisson et al.

(10) Patent No.: US 7,772,028 B2
(45) Date of Patent: Aug. 10, 2010

(54) CMOS IMAGER WITH CU WIRING AND METHOD OF ELIMINATING HIGH REFLECTIVITY INTERFACES THEREFROM

(75) Inventors: James W. Adkisson, Jericho, VT (US); Jeffrey P. Gambino, Westford, VT (US); Mark D. Jaffe, Shelburne, VT (US); Robert K. Leidy, Burlington, VT (US); Richard J. Rassel, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/959,841

(22) Filed: Dec. 19, 2007

(65) Prior Publication Data
US 2008/0108170 A1 May 8, 2008

Related U.S. Application Data

(62) Division of application No. 10/905,277, filed on Dec. 23, 2004, now Pat. No. 7,342,268.

(51) Int. Cl.
*H01L 21/66* (2006.01)

(52) U.S. Cl. ........................ 438/98; 438/70; 438/424; 438/622; 257/E21.597; 257/E21.584

(58) Field of Classification Search ............ 438/22, 438/45, 618, 622, 637, 678, 70, 98, 199, 438/424, 624, 902, FOR. 216, FOR. 219, 438/FOR. 227, 48, 57, 63; 257/E21.584, 257/E21.597, E21.641
See application file for complete search history.

(56) References Cited

U.S. PATENT DOCUMENTS 5,695,810 A * 12/1997 Dubin et al. ............... 438/643
6,326,652 B1 12/2001 Rhodes (Continued)

OTHER PUBLICATIONS

IBM Korea letter reporting Korean Office Action dated Mar. 9, 2010.

*Primary Examiner*—Matthew Smith
*Assistant Examiner*—Qouvaunda Jefferson
(74) *Attorney, Agent, or Firm*—Scully, Scott, Murphy & Presser, P.C.; Richard M. Kotulak, Esq.

(57) ABSTRACT

A CMOS image sensor and method of fabrication wherein the sensor includes Copper (Cu) metallization levels allowing for incorporation of a thinner interlevel dielectric stack to result in a pixel array exhibiting increased light sensitivity. The CMOS image sensor includes structures having a minimum thickness of barrier layer metal that traverses the optical path of each pixel in the sensor array or, that have portions of barrier layer metal selectively removed from the optical paths of each pixel, thereby minimizing reflectance. That is, by implementing various block or single mask methodologies, portions of the barrier layer metal are completely removed at locations of the optical path for each pixel in the array. In a further embodiment, the barrier metal layer may be formed atop the Cu metallization by a self-aligned deposition.

23 Claims, 13 Drawing Sheets

U.S. PATENT DOCUMENTS

| | | |
|---|---|---|
| 6,815,787 B1 | 11/2004 | Yaung et al. |
| 6,844,580 B2 | 1/2005 | Rhodes |
| 6,861,686 B2 * | 3/2005 | Lee et al. .................... 257/291 |
| 7,041,956 B2 | 5/2006 | Takahashi et al. |
| 2003/0038326 A1 | 2/2003 | Fasen et al. |
| 2003/0058547 A1 | 3/2003 | Hori et al. |
| 2003/0214595 A1 | 11/2003 | Mabuchi |
| 2004/0000669 A1 | 1/2004 | Yamamura |
| 2004/0002178 A1 | 1/2004 | Fasen et al. |
| 2004/0002179 A1 | 1/2004 | Barton et al. |
| 2004/0036069 A1 | 2/2004 | Barton et al. |
| 2004/0251395 A1 | 12/2004 | Takahashi et al. |
| 2005/0001146 A1 | 1/2005 | Quinlan |
| 2005/0012124 A1 | 1/2005 | Rhodes |
| 2005/0012166 A1 | 1/2005 | Choi |
| 2005/0017277 A1 | 1/2005 | Rhodes |
| 2005/0077554 A1 | 4/2005 | Rhodes |
| 2005/0087784 A1 | 4/2005 | Lee et al. |
| 2005/0088551 A1 | 4/2005 | Lee et al. |
| 2009/0065821 A1 * | 3/2009 | Lee ........................... 257/292 |

* cited by examiner

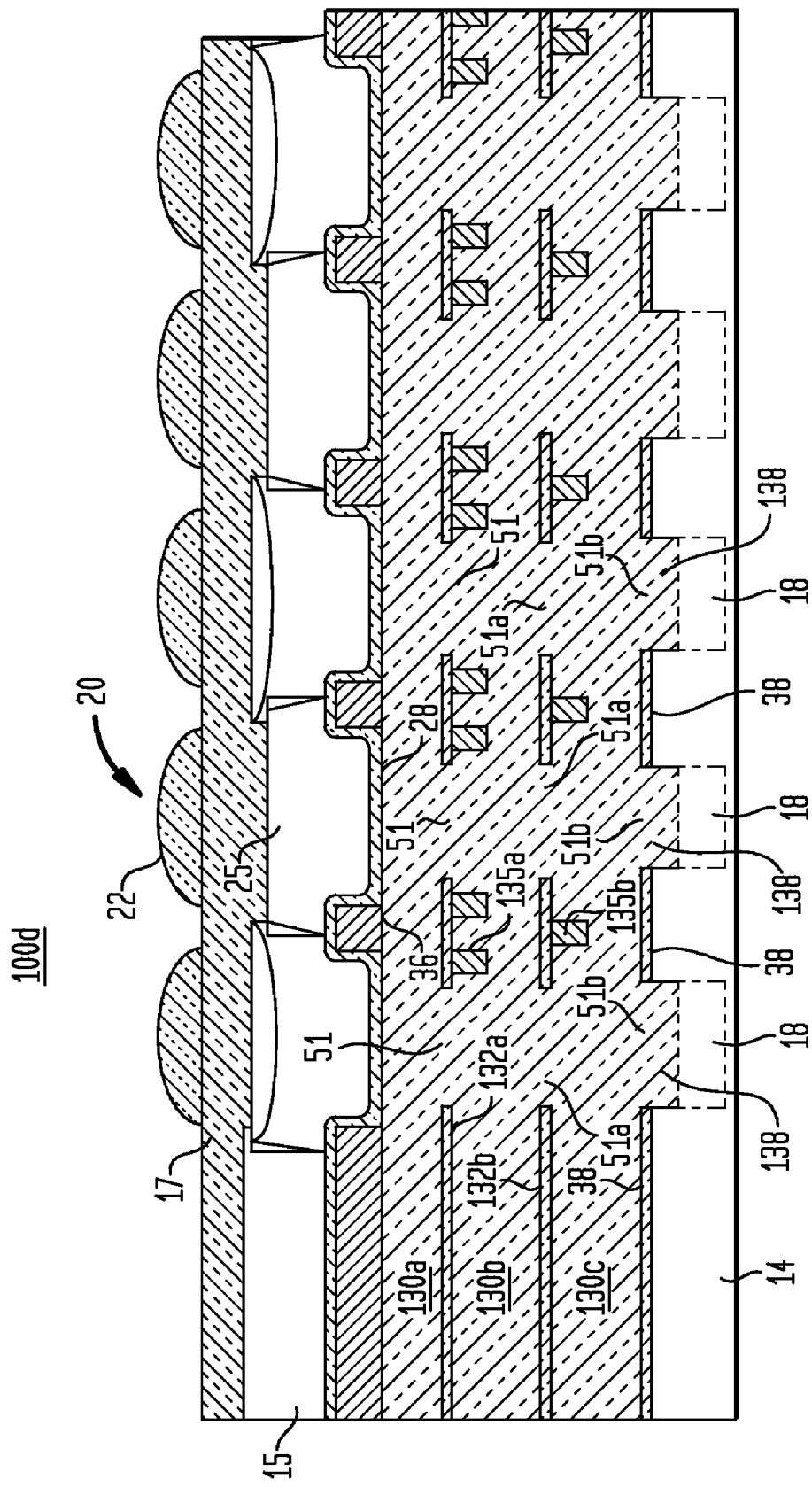

CMOS IMAGER WITH CU WIRING AND METHOD OF ELIMINATING HIGH REFLECTIVITY INTERFACES THEREFROM

CROSS REFERENCE TO RELATED APPLICATIONS

This application is a divisional of U.S. application Ser. No. 10/905,277, filed Dec. 23, 2004, which is related to commonly-owned co-pending U.S. patent application Ser. No. 10/904,807 filed Nov. 30, 2004 and entitled A DAMASCENE COPPER WIRING OPTICAL IMAGE SENSOR, the whole contents and disclosure of which is incorporated by reference as if fully set forth herein.

FIELD OF THE INVENTION

The present invention relates to semiconductor optical image sensors, and particularly, to a novel CMOS (complementary metal oxide semiconductor) image sensor array structure exhibiting reduced reflectivity and increased light sensitivity, and a process for manufacturing such image sensor array.

DESCRIPTION OF THE PRIOR ART

CMOS image sensors are beginning to replace conventional CCD sensors for applications requiring image pickup such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

FIG. 1 depicts a CMOS image sensor pixel array 10 according to the prior art. As shown, the array comprises a plurality of microlenses 12, each having a hemisphere shape, arranged on a smooth planarization layer 17, e.g., a spin on polymer, that is formed on top of a color filter array 15 enabling formation of the microlens array. The color filter array 15 includes individual red, green and blue filter elements 25 (primary color filters) or alternately, cyan, magenta and yellow filter elements (complementary color filter). Each microlens 22 of the microlens array 12 is aligned with a corresponding color filter element 25 and comprises an upper light receiving portion of a pixel 20. The pixel 20 includes a cell portion fabricated upon a semiconductor substrate 14 portion including a stack of comprising one or more interlevel dielectric layers 30a-30c incorporating metallization interconnect levels M1, M2 Aluminum (Al) wire layers 35a, 35b. Interlevel dielectric materials may comprise a polymer or SiO$_2$, for example. As Al metallization interconnect layers 35a, 35b do not require passivation, no respective barrier layers are shown. As further shown in FIG. 1, each pixel cell 20 having the Al metallizations 35a,b further includes a final Aluminum metal level 36 that enables wire bonding to the M1 and M2 metallizations between each pixel 20, and a final passivation layer 28 is formed above the wire bonding level 36. This final passivation layer 28 may comprise SiN, SiO$_2$, or combinations of these. Although not shown in detail, each pixel 20 includes a photoelectric converting device including a light sensitive element such as a photodiode 18 that performs photoelectric conversion and a CMOS transistor (not shown) that performs charge amplification and switching. Each of the pixels 20 generates a signal charge corresponding to the intensity of light received by each pixel and is converted to a signal current by the photoelectric conversion (photodiode) element 18 formed on semiconductor substrate 14. A further barrier or capping layer, e.g., a nitride such as SiN layer 38, is formed above unsilicided diffusion regions formed at the Si substrate 14 surface.

The use of Aluminum metal levels 35a, 35b in current CMOS image sensors require a taller dielectric stack due to the increased resistivity of the Al metal. The taller the dielectric means thicker dielectric layers 30a-30c are required which results in a reduced intensity of light that reaches the pixel photoconversion element (photodiode), i.e., the sensitivity of the pixel 20 is compromised.

As the semiconductor industry is staying with AlCu for the 0.18 mm node CMOS image sensor technology, it would be highly desirable to provide a CMOS image sensor having Copper (Cu) metal lines for the M1, M2 levels which would require a thinner interlevel dielectric stack thus increasing the sensitivity of the pixel array as more light will reach the photodiode. However, as passivation levels are required on Cu metals due to copper's susceptibility to oxidation and contamination, a SiN, SiC, SiCN or like passivation layer is required above the copper wires. However, as passivation layers provide a refractive index mismatch, their presence will tend to reflect light in the optical path of the pixel cell thus degrading device sensitivity.

It would thus be further highly desirable to provide a CMOS image sensor and method of manufacture wherein the sensor comprises Copper (Cu) metal lines for the metallization M1, M2 levels which would enable a thinner interlevel dielectric stack and, further having respective ultra-thin barrier layer portions in the pixel cell optical path or removed from the pixel cell optical path to thereby increase the sensitivity of the pixel cell.

SUMMARY OF THE INVENTION

It thus an object of the invention to provide a CMOS image sensor having Copper (Cu) metallization levels allowing for incorporation of a thinner interlevel dielectric stack to result in a pixel array exhibiting increased light sensitivity. Improved photosensitivity is possible due to simple geometry; as the height is reduced, the amount of light that arrives in the correct pixel is higher for any given angle.

It is a further object of the invention to resolve the refractive index mismatch problem caused by the provision of additional Copper metal passivation layers, and, at the same time, increase the sensitivity of the optical image sensors by optimizing the thickness of the dielectric layers under the lenses.

It a further object of the invention to provide a method of fabricating a CMOS image sensor having Copper (Cu) metallization levels that allow for incorporation of a thinner interlevel dielectric stack to result in a pixel array exhibiting increased light sensitivity.

A number of embodiments are described that include structures having a minimum thickness of barrier layer metal that traverses the optical path of each pixel in the sensor array or, that have portions of barrier layer metal selectively removed from the optical paths of each pixel, thereby minimizing reflectance. For instance, in one embodiment, the barrier layer metal for the Cu interconnect metal wire in the array is formed to be equal to or less than 20 nm in thickness. Alternately, implementing various block or single mask methodologies, portions of the barrier layer metal are completely removed at locations of the optical path for each pixel in the array. In a further embodiment, barrier metal layer may be formed by a self-aligned electroless Cu cap deposition, i.e., self-aligned to the Cu, or by using the same mask to selectively pattern and remove the barrier in the pixel areas.

According to one aspect of the invention, there is provided an image sensor including an array of pixels comprising:
  a semiconductor substrate including a light sensitive element formed therein at each location of a corresponding pixel in the array for receiving incident light;
  a first interlevel dielectric layer formed atop the substrate;
  at least one metal interconnect layer formed atop the first interlevel dielectric layer, the metal interconnect layer including a Cu metal wire structure formed between each light sensitive element in the array; and,
  a second interlevel dielectric layer formed between the Cu metal interconnect layer in the array and a top layer for receiving incident light,
  wherein the Cu metal interconnect layer enables thin first and second interlevel dielectric layers to shorten an optical path and thereby increase an amount of light received by each light sensitive element in the array.

In one embodiment a barrier material layer is formed atop each said Cu metal wire structure that traverses the optical path of each pixel of said array.

In a further embodiment, portions of the barrier material formed atop the metal interconnect layer is selectively removed from regions that traverse an optical path of each array pixel. Further to this embodiment, there is optionally provided for each pixel of the array, a layer of light reflective material formed on pixel sidewalls, the light reflective material layers increasing an amount of light received by the light sensitive element of the pixel.

According to another aspect of the invention, there is provided a method for fabricating an image sensor array of pixels, the method comprising the steps of:
  a. forming a corresponding light sensitive element in a semiconductor substrate for each array pixel, the element adapted to receive light incident to a respective pixel;
  b. forming a first interlevel dielectric layer formed atop the substrate;
  c. forming at least one metal interconnect layer formed atop the first interlevel dielectric layer, the formed metal interconnect layer including a Cu metal wire structure formed between each light sensitive element in the array; and,
  d. forming a second interlevel dielectric layer atop the Cu metal interconnect layer in the array,
  wherein the Cu metal interconnect layer enables formation of thin first and interlevel dielectric layers to shorten an optical path and thereby increase an amount of light received by each light sensitive element in the array.

In one embodiment, a barrier material layer is formed on top each Cu metal wire structure of the metal interconnect layer in a self-aligned process.

In another embodiment, a thin barrier material layer is blanket deposited atop the Cu metal wire structures and atop the first interlevel dielectric layer thereby traversing an optical path of each array pixel.

In further embodiments, the thin barrier material layer is selectively removed at portions that traverse the optical path of each pixel of said array by a variety of processing including implementing one or more masks or in a self-aligned mask process. Further to these embodiments, there is optionally provided for each pixel of the array, a layer of light reflective material formed on pixel sidewalls, the light reflective material layers increasing an amount of light received by said light sensitive element of the pixel.

BRIEF DESCRIPTION OF THE DRAWINGS

The objects, features and advantages of the present invention will become apparent to one skilled in the art, in view of the following detailed description taken in combination with the attached drawings, in which:

FIG. 4(b) illustrates, through a cross-sectional view, an alternate third embodiment of the CMOS image sensor array 100d of FIG. 4(a);

DETAILED DESCRIPTION OF PREFERRED EMBODIMENTS

Figure 1:
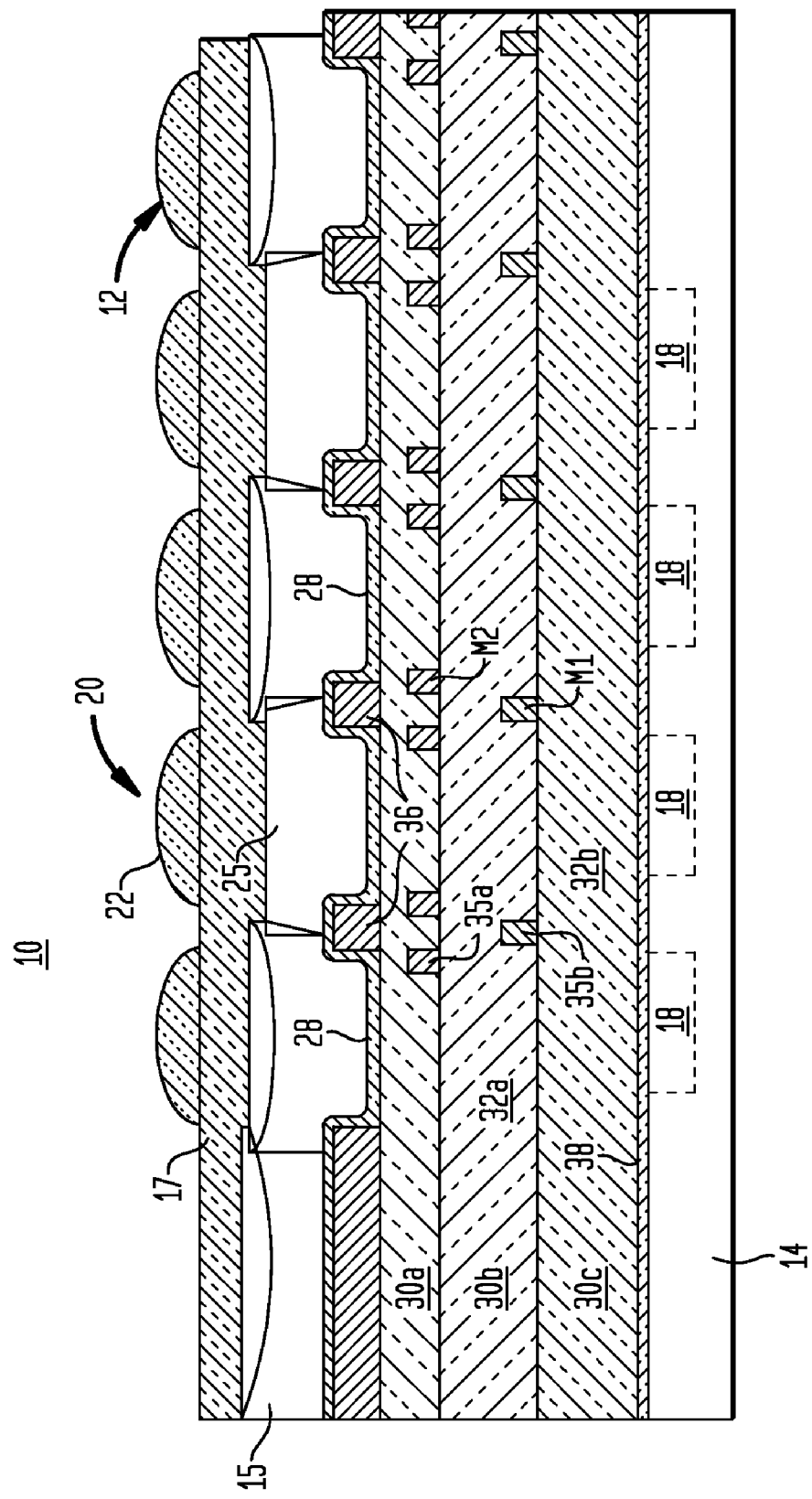
FIG. 1 depicts a CMOS image sensor pixel array 10 according to the prior art.
Figure 2:
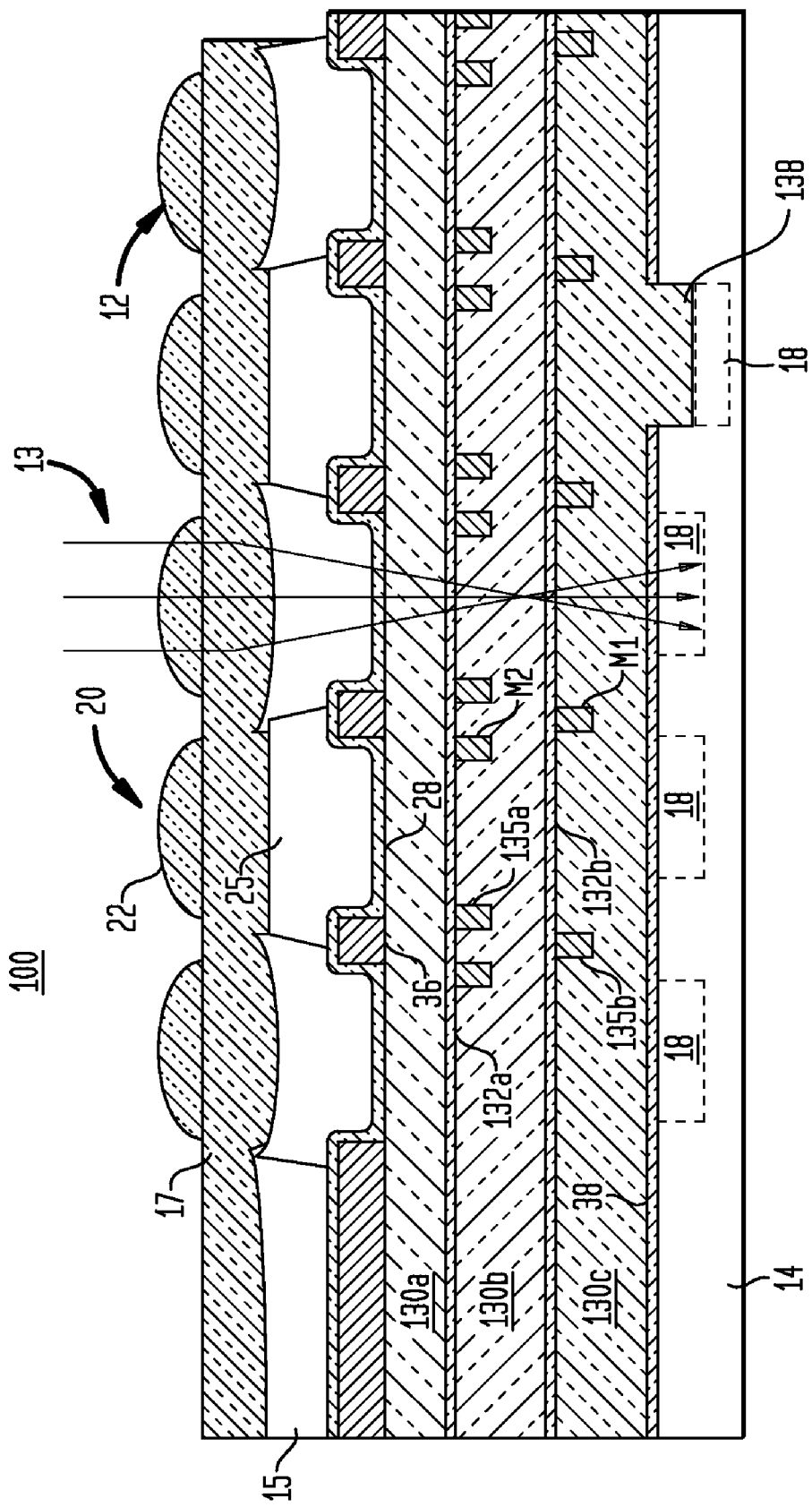
FIG. 2 illustrates, through a cross-sectional view, the CMOS image sensor array 100 according to a first embodiment of the invention.

FIG. 2 illustrates, through a cross-sectional view, a back end of line CMOS image sensor array stack 100 according to a first embodiment of the invention. While the upper light receiving portion of the pixels 20 (microlens and color filters) are the same as the prior art depicted in FIG. 1, the invention includes the formation of Cu metallization interconnects M1, M2 allowing for the formation of thinner stack of interlevel dielectric layers 130a-130c formed on the substrate 14. The substrate 14 may be a bulk semiconductor including, for example, Si, SiGe, SiC, SiGeC, GaAs, InP, InAs and other III-V compound semiconductors, II-V compound semiconductors, or layered semiconductors such as silicon-on-insulators (SOI), SiC-on-insulator (SiCOI) or silicon germanium-on-insulators (SGOI). Preferably, the interlevel dielectric material may comprise an organic or inorganic interlevel dielectric (ILD) material which may be deposited by any of number of well known techniques such as sputtering, spin-on, or PECVD and may include a conventional spun-on organic dielectrics, spun-on inorganic dielectrics or combinations thereof which have a dielectric constant of about 4.2 or less. Suitable organic dielectrics that can be employed in the present invention include dielectrics that comprise C, O, F and/or H. Examples of some types of organic dielectrics that can be employed in the present invention include, but are not limited to: aromatic thermosetting polymeric resins, for example, resins sold by DOW Chemical Company under the tradename SiLK®, Honeywell under the tradename Flare®, and similar resins from other suppliers, and other like organic dielectrics. The organic dielectric employed as interlevel dielectric layers may or may not be porous, with porous organic dielectric layers being highly preferred due to the reduced k value. Suitable inorganic dielectrics that may be employed as the interlevel dielectric typically comprise Si, O and H, and optionally C, e.g., $SiO_2$, FSG (fluorosilicate glass), SiCOH, SiOCH, carbon-doped oxides (CDO), silicon-oxicarbides, organosilicate glasses (OSG) deposited by plasma enhanced chemical vapor deposition (CVD) techniques. Illustrative examples of some types of inorganic dielectrics that can be employed include, but are not limited to: the silsesquioxane HOSP (sold by Honeywell), methyl-silsesquioxane (MSQ), hydrogen silsesquioxane (HSQ), MSQ-HSQ copolymers, $SiO_2$ deposited using tetraethylorthosilicate (TEOS) or $SiH_4$ as a silicon source and $O_2$, $N_2O$, NO, etc. as an oxidizer; organosilanes and any other Si-containing material. For purposes of discussion it is assumed that the inorganic dielectric material is $SiO_2$.

Referring to FIG. 2, the methodology for forming the M1 layer includes first depositing the $SiO_2$ dielectric layer 130c, e.g., to a thickness ranging between about 2 kÅ to 20 kÅ with a range of between 4 kÅ and 5 kÅ preferred, on top of the substrate capping layer 38, patterning trenches in the $SiO_2$ layer 130c using known lithography and RIE techniques, and, lining the formed trenches with a metal liner such as one or more refractory metals, e.g., Ta, TaN, TiN, TiSiN, W, WCN, Ru. Then, the lined trenches are filled with a copper material to form the Cu M1 layer 135b which is subsequently polished using known CMP technique. Thereafter, a barrier or Cu diffusion layer 132b, such as SiN, is deposited on top of the Cu M1 metallization, e.g., to a thickness ranging between about 20 Å to 2 kÅ with a range of between 100 Å and 200 Å preferred. In this embodiment, the thickness of the nitride layer 132b on top of the Cu interconnect is reduced to minimize reflectance. It is understood that other barrier layers materials may be used including, but not limited to, SiON, SiC, SiCN, SiCON, SiCO materials etc. The process is repeated for the subsequent Cu M2 metallization layer whereby a thin M2 dielectric layer 130b, e.g., $SiO_2$, is deposited over the Cu diffusion layer 132b, to a thickness ranging between about 2 kÅ to 20 kÅ, preferably 1 micron, and then the M2 metallization layer is formed by patterning trenches in the $SiO_2$ layer 130b using known lithography and RIE techniques, lining the formed trenches with a metal liner such as a refractory metal, and, filling the lined trenches with a copper material to form the Cu M2 135a layer which is subsequently polished using known CMP technique. Thereafter, a barrier or Cu diffusion layer 132a, such as SiN, is deposited on top of the Cu M2 layer 135a, e.g., to a thickness ranging between about 20 Å to 2 kÅ. The subsequent steps include forming the interlevel dielectric layer 130a on top of the diffusion layer 132a and the final Al metallization according to known techniques. It is preferred that, in the embodiment depicted in FIG. 2, the total thickness of both the M1 and M2 diffusion barriers be about 20 nm or less, in order to minimize reflectance. Further to the embodiment depicted in FIG. 2, it should be understood that an additional layer of materials with an index of refraction that is in between that of SiN (1.98) and $SiO_2$ (1.46), such as SiON, can be formed on top of the thin SiN layers 132a,b to comparable thicknesses (e.g., about 20 Å to 2 kÅ) to further reduce reflections. According to this first embodiment, the provision of Cu metallization and corresponding thin interlevel dielectric layers 130a-130c and minimum diffusion barrier layers 132a,b in the optical path minimizes light reflectance, thus allowing greater amounts of light 13 to flow through the optical path of pixel 20 and reach underlying photodiode 18. As further shown in FIG. 2, in an alternate embodiment, each the pixel array 100 may include an additional STI isolation dielectric region 138 formed in the substrate on top of the light sensitive element, e.g., photodiode 18. In this alternate embodiment, the bottom nitride capping layer 38 is removed from the pixel optical path.

In a second embodiment of the invention, there is performed a selective removal of those portions of the barrier SiN layers 132a,b formed in the pixel array optical paths to avoid the refraction index mismatch problem. In this second embodiment of the CMOS image sensor array 100a, depicted in FIG. 3(a), additional masks (a resist mask or a hardmask) are used at each level of processing to create openings 50 in the SiN barrier layers 132a,b at the location of each pixel's optical path. That is, after each respective barrier layer 132a,b is formed, an additional lithography patterning and etching step (wet or dry etch) is implemented to open up the SiN at the select locations. It is understood however, that a maskless process may be implemented for removing select portions of the SiN layers 132a,b, e.g., using clustered ion beam etching. Preferably, a fluorine-based dry etch (e.g., $CF_4$ plus an oxygen plasma), however, a wet etch is desirable to minimize damage or roughness at the surface after the etch (which might cause reflections or scattering of the light). The wet etch may comprise of a dilute HF "smoothing" etch after SiN RIE, or it could be an $H_3PO_4$ etch to remove the SiN, using $SiO_2$ as a hardmask. Thus, in this embodiment, process steps of forming the interlevel dielectric layer 130b, the Cu M1 metallization layer 135b, and corresponding SiN barrier layer deposition 132b is conducted, and selective removal of the barrier SiN layer 132b in the pixel array is performed. These process steps are then repeated for the subsequent M2 dielectric 130b, metal layer M2 and barrier layer 132a. After the M1 SiN barrier layer 132b is etched, however, the surface of that layer may not be perfectly flat which may compromise the subsequent formed M2 dielectric and, potentially effect the lithography or the polishing of the subsequent Cu for the subsequent M2 level 135a. Thus, after the $SiO_2$ layer 130b for M2 is patterned and deposited, an additional polishing step is performed at the surface of the $SiO_2$ dielectric 130b level before the M2 metallization 135a is patterned. It is further shown in the embodiment depicted FIG. 3(a) that the thin top nitride layer 28 and nitride capping layer 38 shown on top of the substrate 14 (each ranging between about 20 Å to 2 kÅ in thickness) remain without affecting the pixel array sensitivity assuming the photodiode element 18 is situated in an active area directly in the silicon substrate without provision of an dielectric insulator layer 138, e.g., an STI isolation, in the substrate 14 formed on top of the photodiode 18.

Figure 3A:
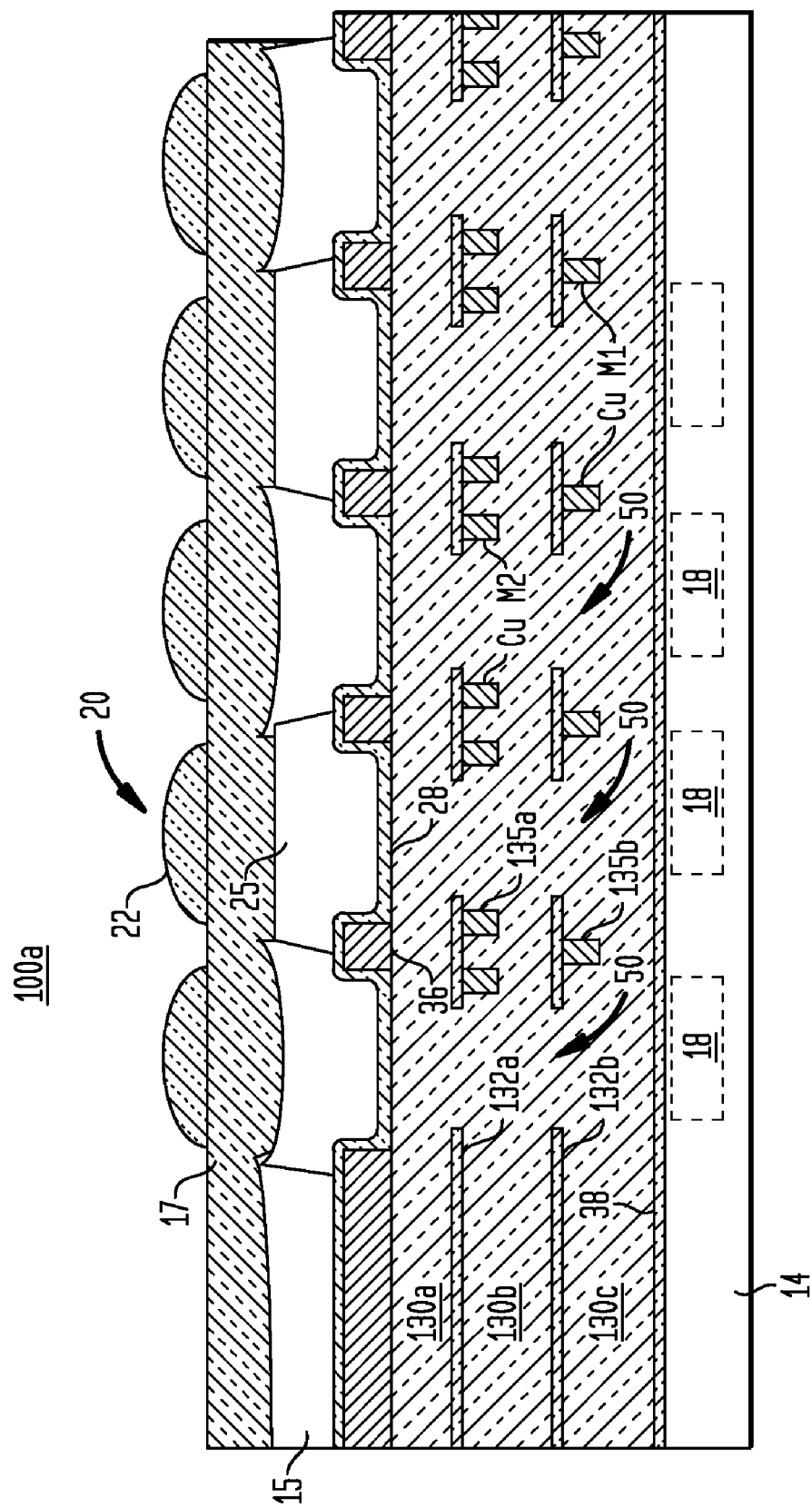
FIG. 3(a) illustrates, through a cross-sectional view, the CMOS image sensor array 100a formed by a method in accordance with a second embodiment of the invention.
Figure 3B:
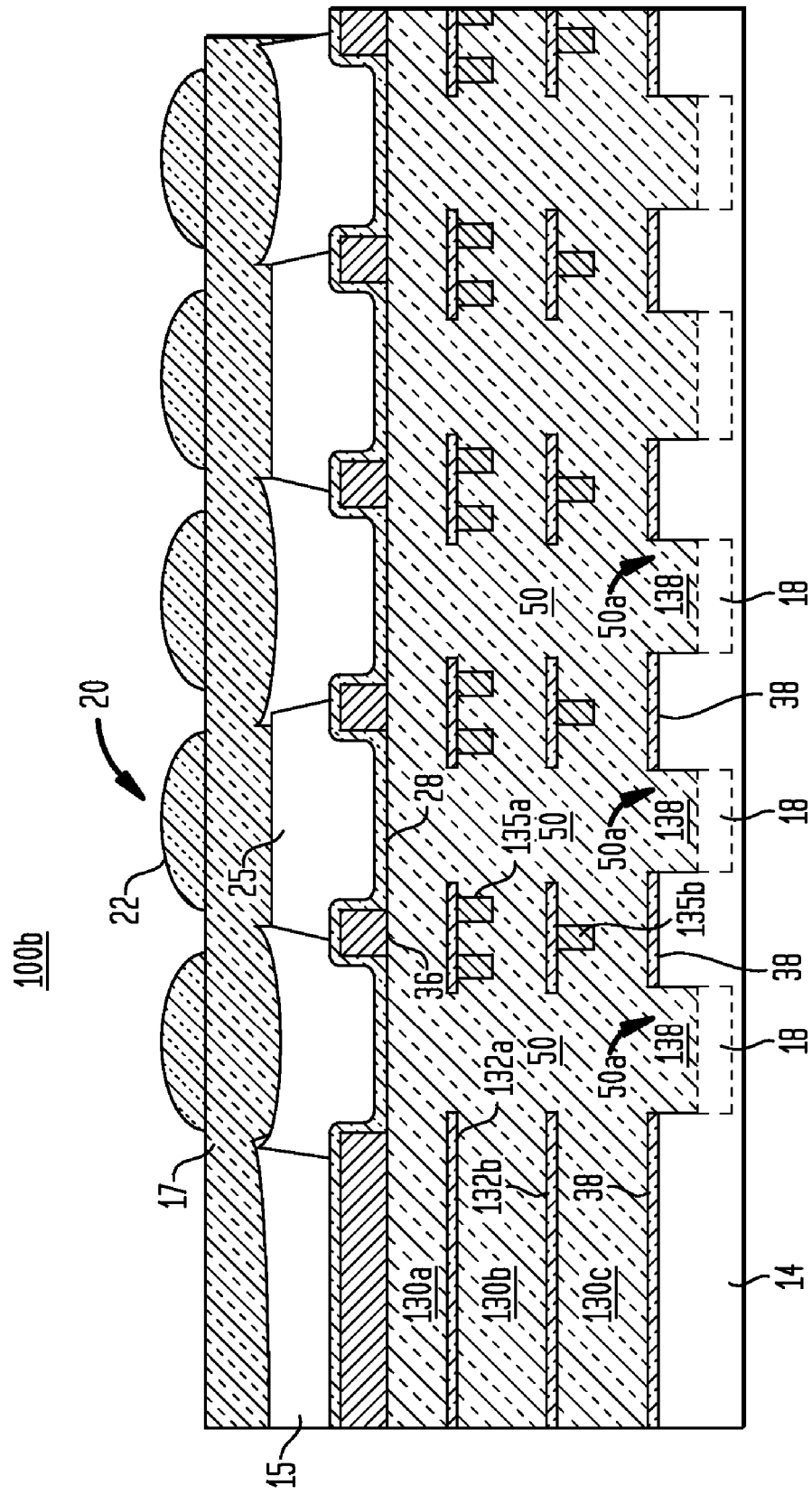
FIG. 3(b) illustrates, through a cross-sectional view, an alternate second embodiment of the CMOS image sensor array 100b of FIG. 3(a)

Thus, in an alternate second embodiment of pixel array 100b depicted in FIG. 3(b), for the embodiment including STI isolation dielectric regions 138 formed on top of the light sensitive element, e.g., photodiode 18, it is advantageous to remove the substrate capping layer 38 in the optical path on top of the substrate 14 image sensor array 100a in addition to the M1 and M2 level dielectrics 132a,b in the optical path. Thus, in the manner described herein with respect to FIG. 3(a), an additional mask is required and additional lithographic patterning and etching steps (wet or dry etch) implemented to provide additional openings 50a in the SiN capping layer 38 at the locations of the pixel's optical path.

Figure 4A:
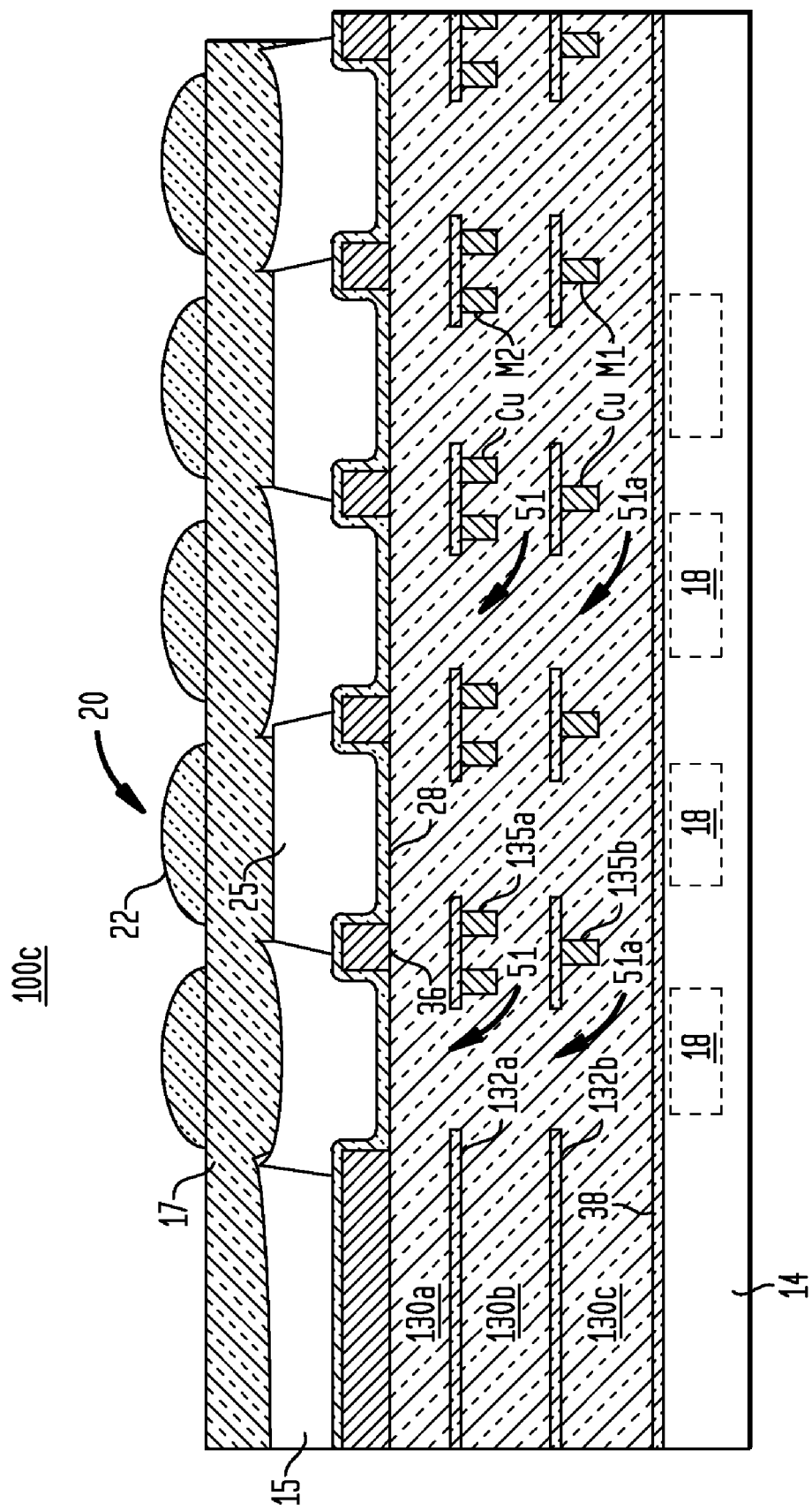
FIG. 4(a) illustrates, through a cross-sectional view, the CMOS image sensor array 100c formed by a method in accordance with a Third embodiment of the invention.

FIG. 4(a) illustrates, through a cross-sectional view, the CMOS image sensor array 100c according to a third embodiment of the invention which corresponds to the image sensor embodiment depicted in FIG. 3(a) without the STI regions 138 above the pixel's light sensitive element (photodiode) 18 in the substrate 14. According to this embodiment, the substrate capping layer 38, interlevel dielectric layer 130a, interlevel metallization 135b (M1) and corresponding barrier layer 132b, e.g., SiN, are formed without the M1 barrier etching. Then, the M2 dielectric layer 130b, metallization M2 135a and corresponding barrier layer 132a, e.g., SiN, are formed. A mask is subsequently patterned and an etch is conducted to create an opening 51 to remove that portion of the Nitride barriers 132a for the M2 layer from the pixels' optical paths. However, in the same etch process step, the M2 dielectric layer 130b and the M1 barrier opening 51a is created so that the only one mask is needed to remove both metallization barrier layers 132a,b in the optical path. After this etch, the interlevel dielectric (e.g., oxide) is deposited back into the etched path, e.g. a spin-on SiO$_2$ refill process, and a planarization step is performed. It is understood that the fill dielectric may alternately comprise a polymer dielectric (polyimide, Dow Chemical's SiLK®, etc.) and that other techniques for depositing the interlevel dielectric (oxide, SiO$_2$, or carbon-based oxides, etc.) having excellent gap fill capability such as CVD or (plasma enhanced) PE-CVD processing may be used.

In an alternate third embodiment depicted in FIG. 4(b), where the image sensor array 100d includes STI isolation dielectric regions 138 formed on top of the light sensitive element, e.g., photodiode 18, it is advantageous to remove the bottom nitride layer 38 shown on top of the substrate 14 in addition to the M1 and M2 level dielectrics 132a,b. Thus, in the manner described herein with respect to FIG. 4(a), after formation of the M2 barrier level 132a, a lithographic patterning of a single mask is performed and an etch is conducted to create openings 51, 51a and 51b in each of the barrier levels in the pixel's optical path. That is, the etch is conducted to remove the M2 Nitride barrier, and at the same time the M2 dielectric layer 130b, the M1 barrier, the M1 dielectric layer 130c and, the additional bottom nitride layer using the preferred dry etch techniques described herein (e.g., CF4 and O$_2$ plasma). It is understood that a wet etch may be optionally performed to remove the barrier layer materials. Thereafter, the etched path is again filled with an interlevel dielectric, e.g. a spin-on SiO$_2$ or polymer dielectric (polyimide, Dow Chemical's SiLK®, etc.) refill process, and a planarization step is performed. It is understood that other techniques for depositing the interlevel dielectric (oxide, SiO$_2$, or carbon-based oxides, etc.) having excellent gap fill capability such as CVD or (plasma enhanced) PE-CVD processing may be used.

Figure 5A:
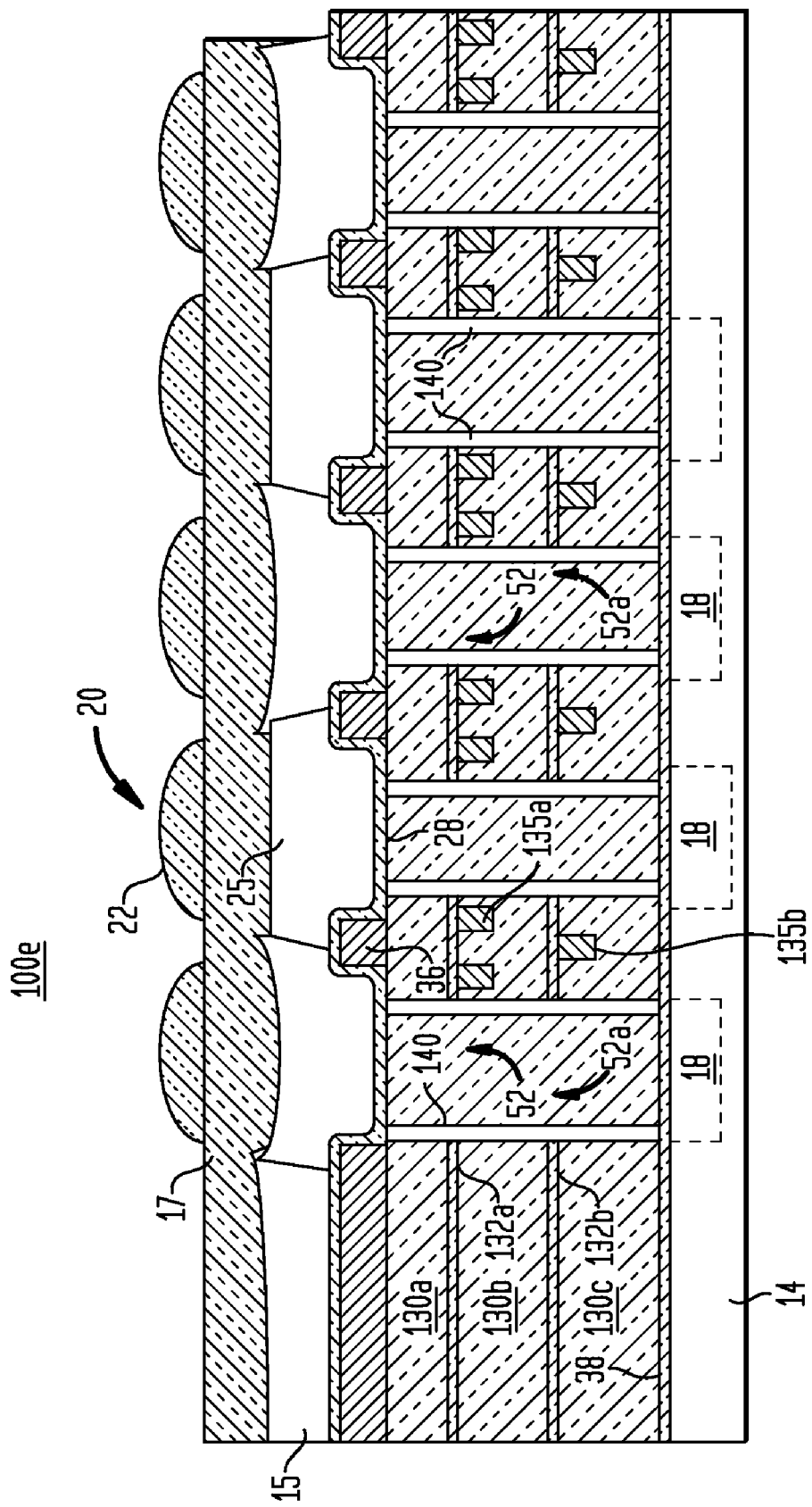
FIG. 5(a) illustrates, through a cross-sectional view, the CMOS image sensor array 100e formed by a method in accordance with a fourth embodiment of the invention.

FIG. 5(a), through a cross-sectional view, illustrates the CMOS image sensor array 100e according to a fourth embodiment of the invention which corresponds to the image sensor embodiment depicted in FIG. 3(a) without formed dielectric (e.g., STI) regions 138 above the pixel's light sensitive element (photodiode) 18 in the substrate 14. According to this embodiment, the substrate capping layer 38, interlevel dielectric layers 130a-130c, interlevel metallizations 35a, 35b (M2 and M1) and corresponding barrier layers 132a,b, e.g., SiN, are formed. However, after the formation of the top interlevel dielectric layer 130a, a lithographic patterning and application of a single mask is performed and an etch is conducted to create openings 52 and 52a in each of the respective M2 and M1 barrier levels in the pixel's optical path. That is, in a single etch step, each of the barrier layers 132a,b for each of the metallizations are removed in addition to each of the interlevel dielectric layers 130a-130c (using a single mask). Further, in this embodiment, after opening the hole in the optical path and prior to filling the hole with the interlevel dielectric (e.g., oxide), a thin nitride liner 140 is deposited that conforms to the sidewalls and bottom of the etched hole. Preferably, a SiN material or a thin liner material having light reflective properties may be deposited to line the bottom and sidewalls of the etched opening using known deposition techniques such as PE-CVD. For example, other liner materials having light reflective properties include but are not limited to: SiC, certain metals, e.g. Al, TiN, Tungsten, Ru, Poly-Si, Poly-Ge, etc. This thin liner 140 may be deposited to a thickness ranging between 50 Å to 2 kÅ and effectively functions to prevent mobile ion ingress and additionally act as a mirror surface to reflect scattered light so that any light that enters the lens at an angle will reach the photodiode. In a subsequent step, after depositing the thin nitride liner, the interlevel dielectric material is deposited back into the lined hole utilizing, e.g. a spin-on SiO$_2$ refill process, and a final planarization step is performed.

Figure 5B:
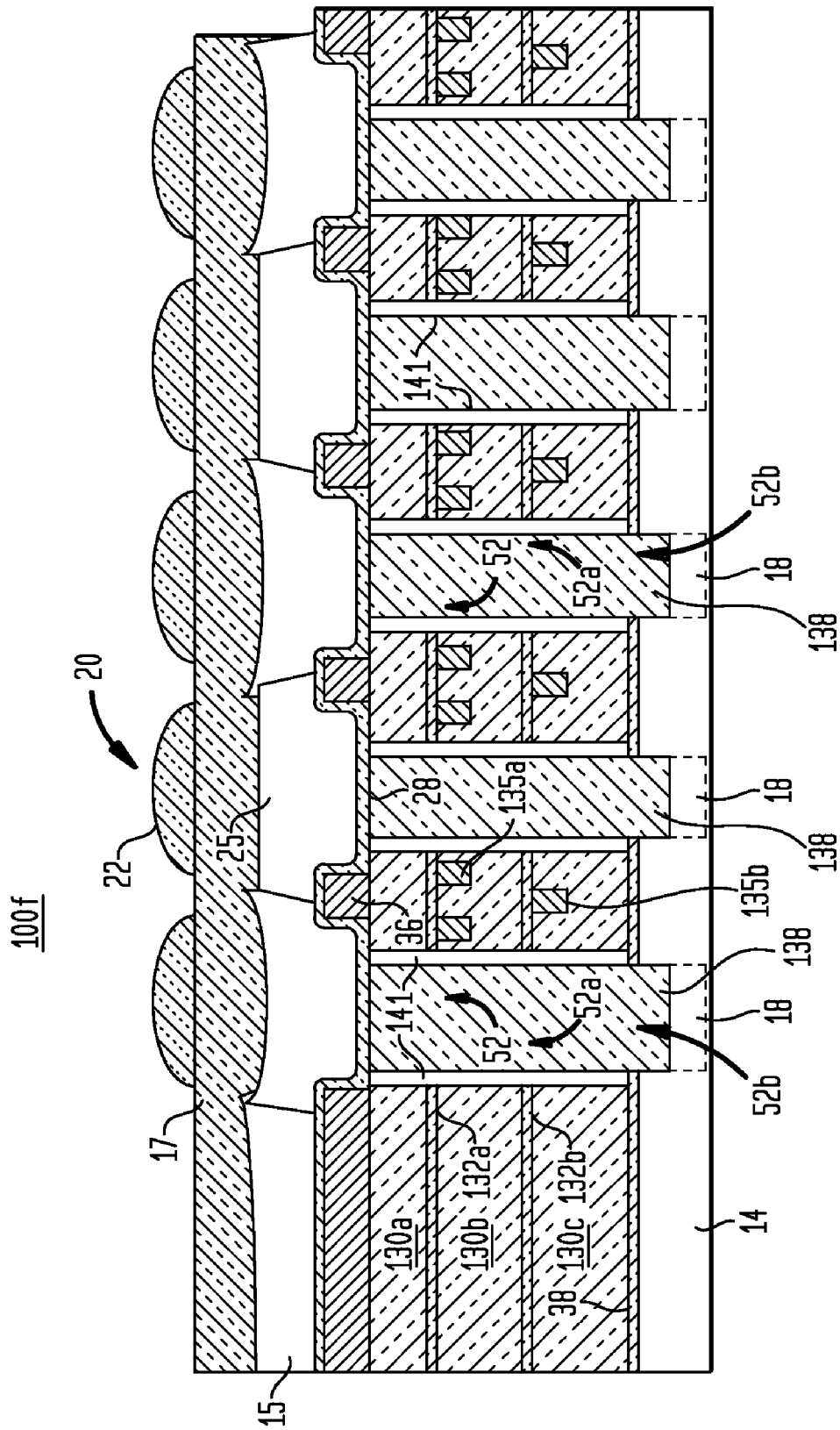
FIG. 5(b) illustrates, through a cross-sectional view, an alternate fourth embodiment of the CMOS image sensor array 100f of FIG. 5(a)

In an alternate fourth embodiment depicted in FIG. 5(b), where the image sensor array 100f includes STI isolation dielectric regions 138 formed on top of the light sensitive element, e.g., photodiode 18, it is advantageous to remove those portions of the bottom nitride layer 38 shown on top of the substrate 14 in the pixel optical path in addition to the M1 and M2 level barriers 132a,b. Thus, in the manner described herein with respect to FIG. 5(a), after lithographically patterning and applying a single mask, a single etch is conducted to create openings 52, 52a and 52b in each of the barrier levels in the pixel's optical path. That is, the single etch process is conducted to remove the M2 Nitride barrier, and at the same time the M2 dielectric layer 130b, the M1 barrier, the M1 dielectric layer 130c and, the additional bottom nitride layer 38 using the preferred dry etch techniques described herein (e.g., CF$_4$ and O$_2$ plasma). It is understood that a wet etch may be performed to remove the barrier layer materials. Then, after opening the hole in the optical path and prior to filling the hole with the interlevel dielectric, thin nitride spacers 141 are deposited that conforms to the sidewalls and bottom of the etched hole. Preferably, a SiN material or a thin liner material having light reflective properties may be deposited to line the hole using known deposition techniques. Thereafter, the reflective liner material conforming to the bottom of the hole is removed by a spacer etch, i.e., any directional etch that is used to form SiN spacers along the sidewalls of an etched opening. For example, a F-based directional etch is used to form SiN spacers. In a subsequent step, after depositing the thin nitride and etching to form spacers 141, the interlevel dielectric material is deposited back into the lined hole utilizing, e.g. a spin-on SiO$_2$ refill process, and a final planarization step is performed.

Figure 6A:
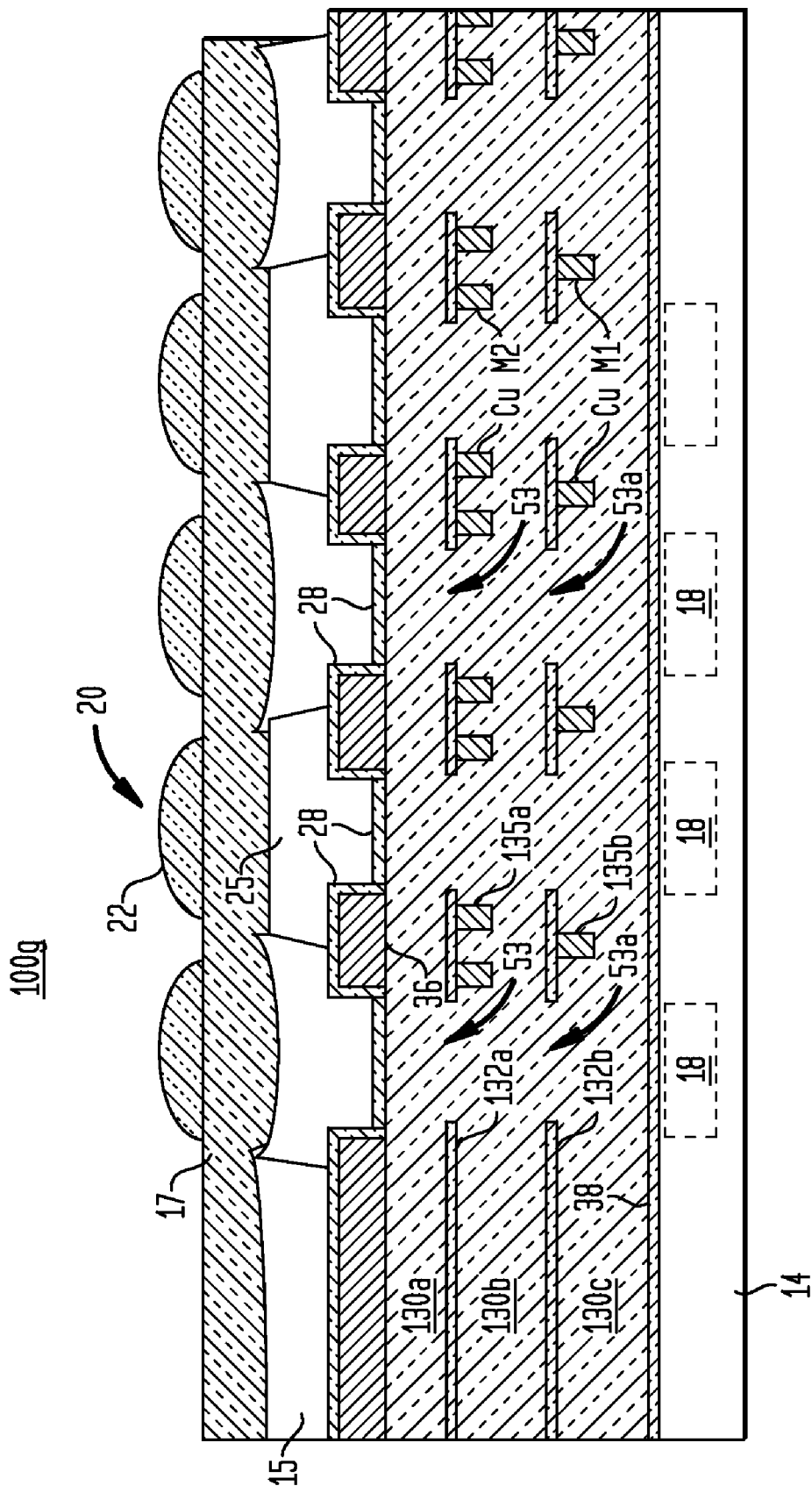
FIG. 6(a) illustrates, through a cross-sectional view, the CMOS image sensor array 100g formed by a method in accordance with a fifth embodiment of the invention.

FIG. 6(a) illustrates, through a cross-sectional view, the CMOS image sensor array 100g according to a fifth embodiment of the invention which corresponds to the image sensor embodiment depicted in FIG. 3(a) without the formed STI regions above the pixel's light sensitive element (photodiode) 18 in the substrate 14. According to this embodiment, the substrate capping layer 38, interlevel dielectric layers 130a-130c, interlevel Cu metallizations 135a, 135b (M2 and M1)

and corresponding barrier layers 132a,b, e.g., SiN, are formed. Additionally formed is the top metal conductor (i.e., Aluminum) layer 36 patterned as shown in FIG. 6(a) between each pixel. However, after the patterning of the top Aluminum layer 36, a single etch process is conducted to create openings 53 and 53a in each of the respective M2 and M1 barrier levels in the pixel's optical path. That is, in the single etch step, each of the barrier layers 132a,b for each of the metallization levels are removed, in addition to each of the interlevel dielectric layers 130a-130c using the patterned Al layer 36 which functions as a self-aligned mask. Then, in a subsequent step, the interlevel dielectric material is deposited back into the etched hole utilizing, e.g. a spin-on $SiO_2$ refill process, and a final planarization step is performed.

Figure 6B:
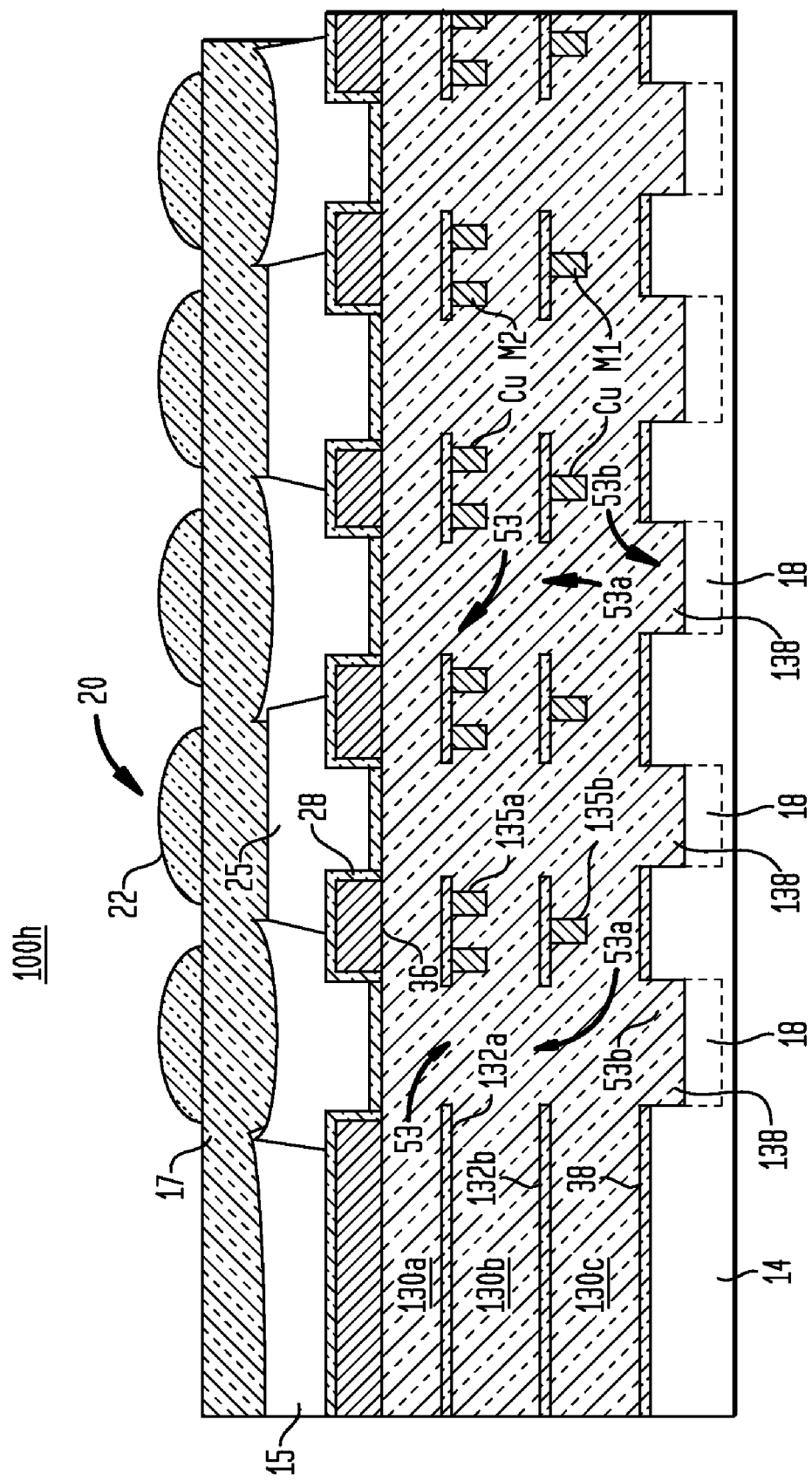
FIG. 6(b) illustrates, through a cross-sectional view, an alternate fifth embodiment of the CMOS image sensor array 100h of FIG. 6(a)

In an alternate fifth embodiment depicted in FIG. 6(b), where the image sensor array 100h includes STI isolation dielectric regions 138 formed on top of the light sensitive element, e.g., photodiode 18, it is advantageous to remove those portions of the bottom nitride layer 38 shown on top of the substrate 14 in the pixel optical path in addition to the M1 and M2 level barriers 132a,b. Thus, in the manner described herein with respect to FIG. 6(a), after lithographically patterning the Al layer 36 that additionally functions as a single self-aligned mask, a single (wet or dry) etch is conducted to create openings 53, 53a and 53b in each of the barrier levels in the pixel's optical path. That is, the etch is conducted to remove the M2 Nitride barrier, and at the same time the M2 dielectric layer 130b, the M1 barrier, the M1 dielectric layer 130c and, the additional bottom nitride layer 38 using the preferred dry etch techniques described herein (e.g., $CF_4$ and $O_2$ plasma). It is understood that a wet etch process may be performed to remove the barrier layers 132a,b and capping layer 38.

Figure 7A:
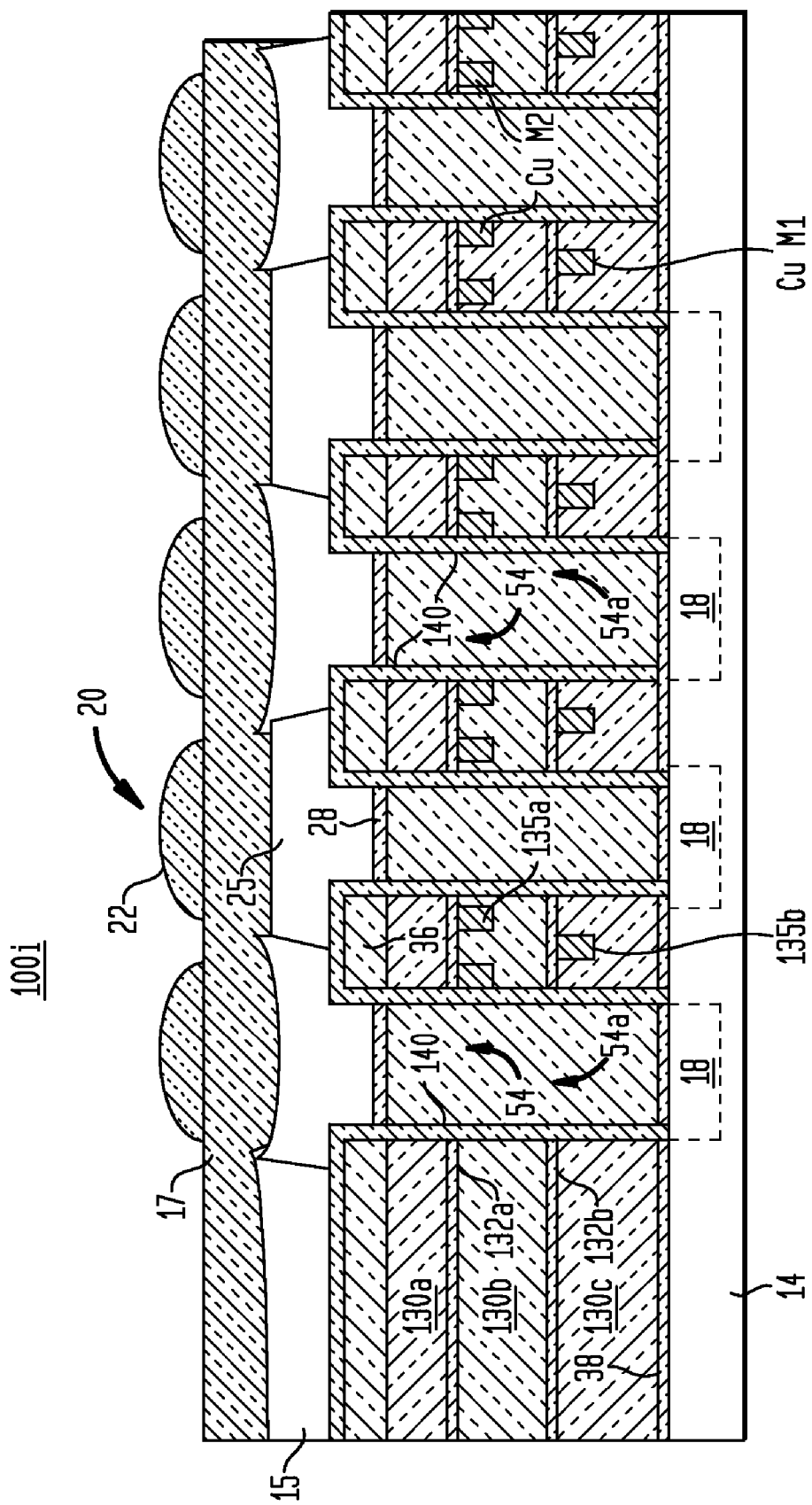
FIG. 7(a) illustrates, through a cross-sectional view, the CMOS image sensor array 100i formed by a method in accordance with a sixth embodiment of the invention.

FIG. 7(a) illustrates, through a cross-sectional view, the CMOS image sensor array 100i according to a sixth embodiment of the invention which corresponds to the image sensor embodiment depicted in FIG. 3(a) without the STI regions above the pixel's light sensitive element (photodiode) 18 in the substrate 14. According to this embodiment, the substrate capping layer 38, interlevel dielectric layers 130a-130c, interlevel metallizations 135a, 135b (M2 and M1) and corresponding barrier layers 132a,b, e.g., SiN, are formed. Additionally formed is the top metal conductor (i.e., Aluminum) layer 36 patterned as shown in FIG. 7(a) between each pixel. However, after the patterning of the top Aluminum layer 36, a single etch process is conducted to create openings 54 and 54a in each of the respective M2 and M1 barrier levels in the pixel's optical path. That is, in the single etch step, each of the barrier layers 132a,b for each of the metallization levels are removed in addition to each of the interlevel dielectric layers 130a-130c using the patterned Al layer 36 which functions as a self-aligned mask. Further, in this embodiment, after opening the hole in the optical path and prior to filling the hole with the interlevel dielectric (e.g., oxide), a thin nitride liner 140 is deposited that conforms to bottom and sidewalls of the etched hole. Preferably, a SiN material or a thin liner material having light reflective properties may be deposited to line the hole using known deposition techniques such as PE-CVD, as described. This thin reflecting liner 140 may be deposited to a thickness ranging between 50 Å to 2 kÅ and effectively acts as a mirror surface to reflect scattered light so that any light that enters the pixel lens at an angle will reach the photodiode. In a subsequent step, after depositing the thin nitride liner, the interlevel dielectric material is deposited back into the lined hole utilizing, e.g. a spin-on $SiO_2$ refill process, and a final planarization step is performed.

Figure 7B:
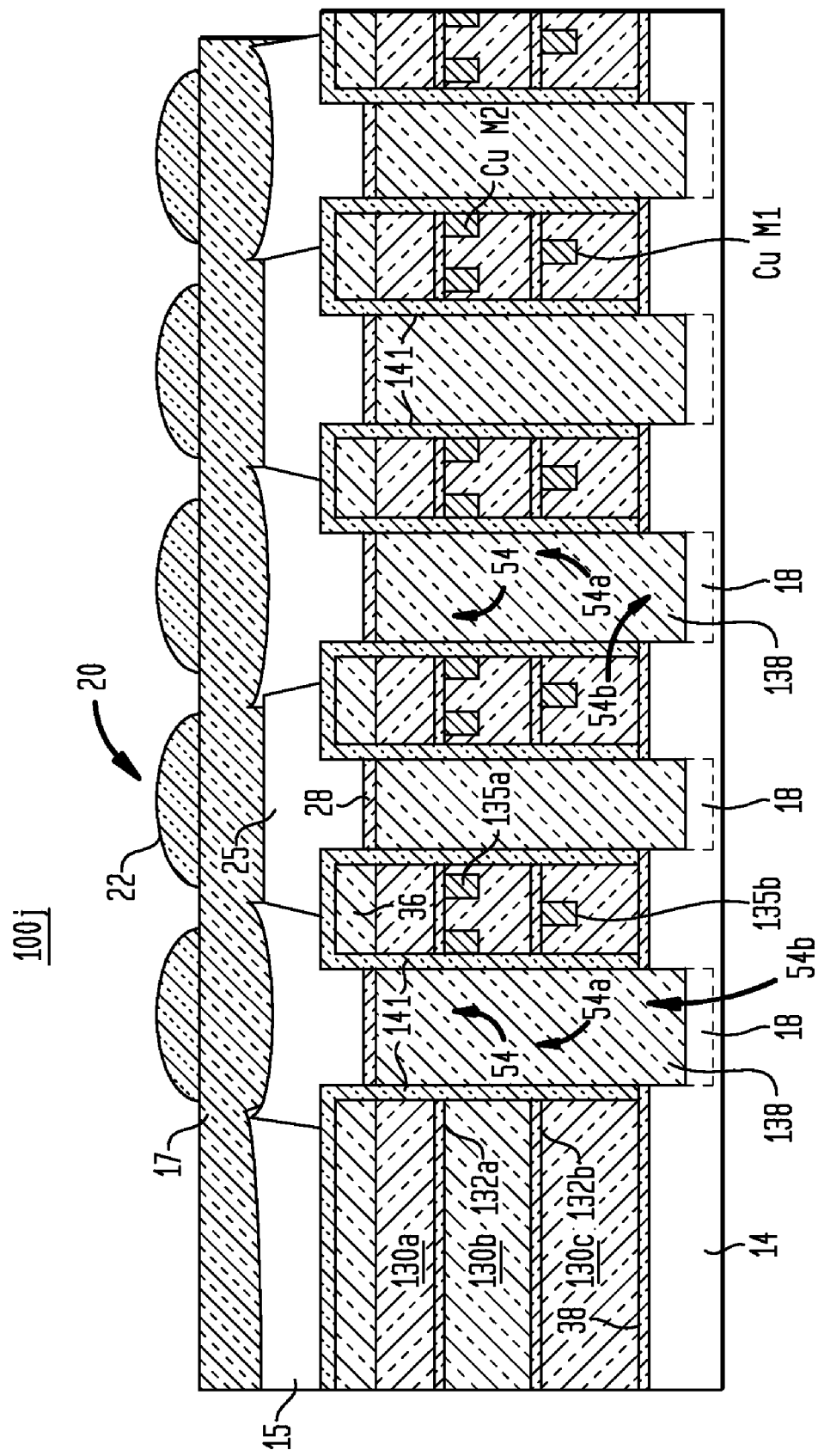
FIG. 7(b) illustrates, through a cross-sectional view, an alternate sixth embodiment of the CMOS image sensor array 100j of FIG. 6(a); and, FIG. 8 illustrates, through a cross-sectional view, alternate embodiments of the CMOS image sensor array of the invention incorporating a self-aligned mask process to selectively deposit a barrier material on the Cu metallizations.

In an alternate sixth embodiment depicted in FIG. 7(b), where the image sensor array 100j includes STI isolation dielectric regions 138 formed on top of the light sensitive element, e.g., photodiode 18, it is advantageous to remove those portions of the bottom nitride layer 38 shown on top of the substrate 14 in the pixel optical path in addition to the M1 and M2 level dielectrics 132. Thus, in the manner described herein, after lithographically patterning the Al layer 36 that additionally functions as a single self-aligned mask, a single (wet or dry) etch is conducted to create openings 54, 54a and 54b in each of the barrier levels in the pixel's optical path. That is, the etch is conducted to remove the M2 Nitride barrier, and at the same time the M2 dielectric layer 130b, the M1 barrier, the M1 dielectric layer 130c and, the additional bottom nitride layer 38 using the preferred dry etch techniques described herein (e.g., $CF_4$ and $O_2$ plasma). It is understood that a wet etch process may be performed to remove the barrier layers 132a,b and capping layer 38. Further, in this embodiment, after opening the hole in the optical path and prior to filling the hole with the interlevel dielectric (e.g., oxide), thin nitride spacers 141 are deposited that conform to the sidewalls of the etched hole. Preferably, a SiN material or a thin liner material having light reflective properties may be deposited to line the hole using known deposition techniques such as PE-CVD, as described. This thin reflecting spacer 141 may be deposited to a thickness ranging between 50 Å to 2 kÅ and effectively acts as a mirror surface to reflect scattered light so that any light that enters the lens at an angle will reach the photodiode. In a subsequent step, after depositing the thin nitride spacers, the interlevel dielectric material is deposited back into the lined hole utilizing, e.g. a spin-on $SiO_2$ refill process, and a final planarization step is performed.

Figure 8:
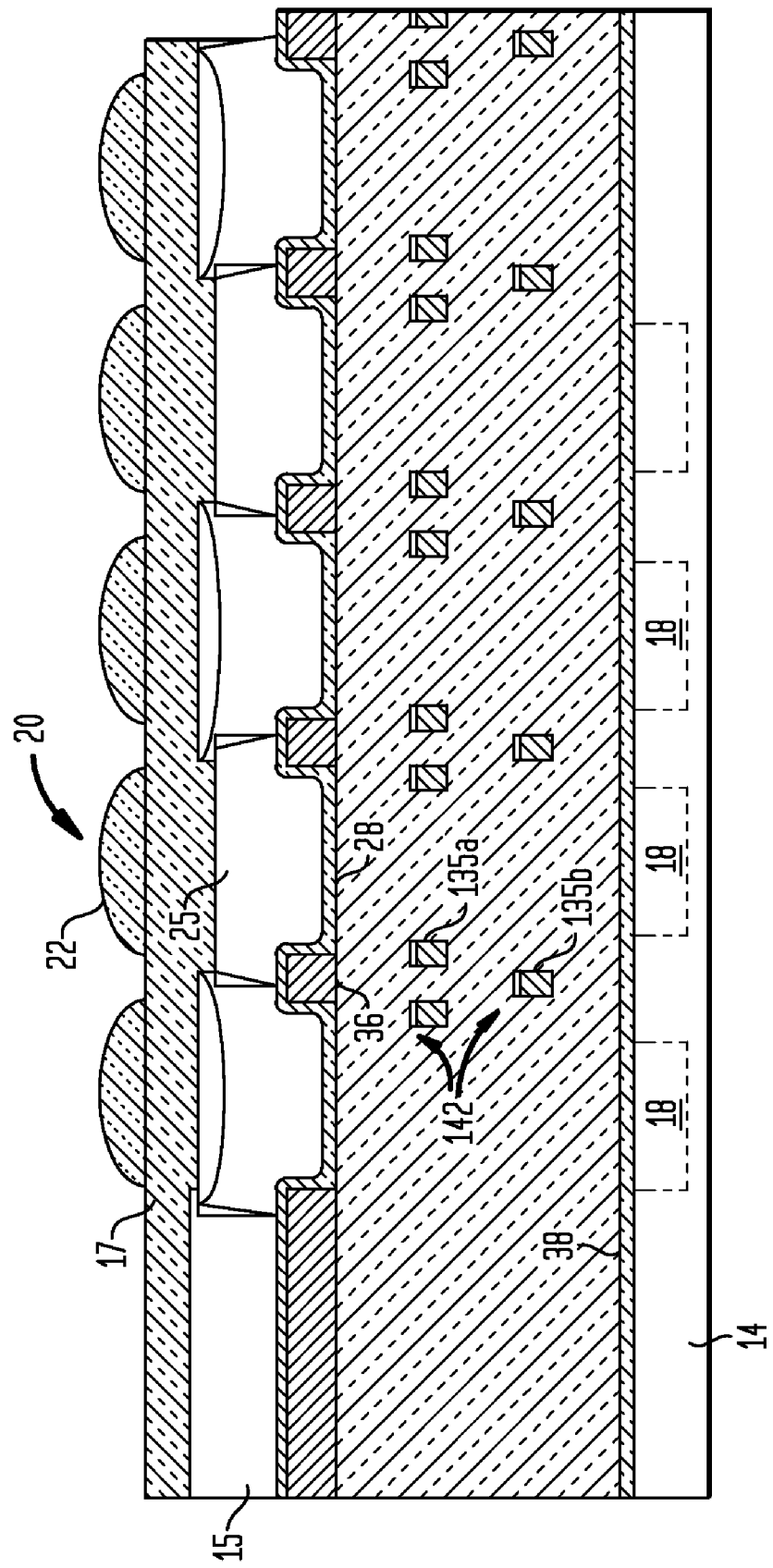

It should be understood that in each of the embodiments described herein with respect to FIGS. 3(a)-7(b) a self-aligned Cu metal cap, e.g., CoWP, may be formed, for example, by electroless plating, rather than forming a blanket SiN cap and removing the select portions of the barrier levels 132a,b in the optical paths as described. Thus, as shown in FIG. 8, after the patterning formation of each Cu metallization layer and polishing thereof, an electroless plating may be performed in a self-aligned process to selectively deposit a barrier material 142, e.g., a compound such as NiWP, CoWP, CoWB directly on the Cu which protects the Cu against oxidation. Alternately, a deposition process, e.g., a CVD may be performed for selectively depositing a barrier layer material such as a refractory metal including but not limited to W. Alternately, after each Cu CMP step, the Cu is recessed by either a wet etch, electropolishing, or dry etch. Then, a blanket capping layer (Ta, TaN, W, SiN, SiC) is deposited and a polishing step conducted to remove those capping layer portions formed in the regions between the metal lines.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for fabricating an image sensor array of pixels comprising:

forming a corresponding light sensitive element in a semiconductor substrate for each array pixel, said element adapted to receive light incident to a respective pixel, said forming step further including the step of forming a structure of insulator material in said substrate above said light sensitive element at each pixel, forming a first interlevel dielectric layer formed atop said substrate;

forming a barrier material layer between said substrate and said first interlevel dielectric layer;

forming at least one metal interconnect layer formed atop said first interlevel dielectric layer, said formed metal interconnect layer including a Cu metal wire structure formed between each light sensitive element in said array; and forming a second interlevel dielectric layer atop said Cu metal interconnect layer in said array, wherein said Cu metal interconnect layer enables formation of thin first and second interlevel dielectric layers to shorten an optical path and thereby increase an amount of light received by each light sensitive element in said array, and said method further comprising the step of selectively removing portions of said barrier material layer above said substrate at a region corresponding to said insulator material structure formed above said light sensitive element at each pixel.

2. The method as claimed in claim 1, wherein said step of forming a metal interconnect layer including a Cu metal wire structure formed at locations between each light sensitive element in said array comprises:

applying a mask over said first interlevel dielectric layer, said mask patterned to open up trenches between each photodiode in said first interlevel dielectric layer;

conducting an etch process to open up said trenches at said locations between each photodiode; and, depositing Cu metal in said trenches to form said metal wire structures.

3. The method as claimed in claim 2, wherein said step of forming a metal interconnect layer further comprises the step of conducting a chemical-mechanical polishing step of said metal wire structures.

4. The method as claimed in claim 3, further comprising the step of forming a barrier material layer on top each said Cu metal wire structure of said metal interconnect layer, said forming including implementing a self-aligned process to deposit said barrier material layer on top each formed said Cu metal wire structure of said metal interconnect layer.

5. The method as claimed in claim 4, wherein said step of depositing in a self-aligned process a barrier material on top each said Cu metal wire structure further comprises performing an electroless plating process.

6. The method as claimed in claim 5, wherein said barrier material deposited in said electroless plating process comprises NiWP, CoWP or CoWB.

7. The method as claimed in claim 1, further comprising the steps of: forming a barrier material layer on top said Cu metal wire structures of said metal interconnect layer by blanket depositing a barrier material layer atop said Cu metal wire structures and atop said first interlevel dielectric layer thereby traversing an optical path of each array pixel.

8. The method as claimed in claim 7, further including the step of selectively removing portions of said barrier material layer at regions in line with an optical path of each pixel of said array.

9. The method as claimed in claim 8, wherein said step of selectively removing portions of said barrier material layer at regions in line with an optical path comprises, after blanket depositing said barrier material layer, the steps of:

applying a mask structure lithographically patterned to open up regions of said barrier material layer at locations traversing said optical path of each pixel; and conducting an etch process to remove the barrier material layer at said regions.

10. The method as claimed in claim 8, wherein said step of selectively removing portions of said barrier material layer at regions in line with an optical path comprises, after forming a second interlevel dielectric layer atop said Cu metal interconnect layer in said array, the steps of:

applying a mask structure lithographically patterned to open up holes at locations traversing said optical path of each pixel;

conducting an etch process to selectively remove portions of the second interlevel dielectric layer and barrier material layer portions at said regions; and, refilling interlevel dielectric material back into holes created by said etch.

11. The method as claimed in claim 8, wherein said image sensor array further comprises a top metallization layer formed beneath a color filter array and comprising a metal bonding structure formed between each photodiode in said array, said step of selectively removing portions of said barrier material layer at regions in line with an optical path comprises, after forming said top metallization layer in said array, the steps of:

conducting an etch process utilizing said metal bonding structures of said top metallization layer as a self-aligned mask to selectively remove portions of the second interlevel dielectric layer and barrier material layer portions at said regions traversing said optical path of each pixel; and, refilling interlevel dielectric material back into holes created by said etch.

12. The method as claimed in claim 10, wherein said step of conducting an etch process to selectively remove portions of the second interlevel dielectric layer and barrier material layer portions at said regions traversing said optical path of each pixel further includes etching to remove a portion of said first interlevel dielectric layer at said regions to open up a hole corresponding to said pixel optical path, wherein prior to said refilling step, the step of:

depositing a thin liner of light reflective material that conforms to the sidewalls of the etched hole.

13. The method as claimed in claim 11, wherein said step of conducting an etch process to selectively remove portions of the second interlevel dielectric layer and barrier material layer portions at said regions traversing said optical path of each pixel further includes etching to remove a portion of said first interlevel dielectric layer at said regions to open up a hole corresponding to said pixel optical path, wherein prior to said refilling step, the step of:

depositing a thin liner of light reflective material that conforms to the sidewalls of the etched hole.

14. The method as claimed in claim 1, further comprising a step of forming a top layer comprising an array of filter elements, each filter element corresponding to an array pixel.

15. The method as claimed in claim 14, further comprising a step of forming an array of pixel microlens on said top layer in alignment with said array of filter elements, with each microlens corresponding to a filter element.

16. A method for fabricating an image sensor array of pixels comprising the steps of:

forming a corresponding light sensitive element in a semiconductor substrate for each array pixel, said element adapted to receive incident light, said forming further includes the step of forming a structure of insulator material in said substrate above said light sensitive element at each pixel; and forming a stack of interlevel dielectric layers atop said substrate, forming a barrier material layer between said substrate and a first interlevel dielectric layer of said stack, and between forming of adjacent interlevel dielectric layers of said stack, the steps of:

forming a Cu metallization level including a Cu metal wire structure formed between each light sensitive element in said array, wherein said Cu metallization levels enables a thinner stack of interlevel dielectric layers to shorten an optical path and thereby increase amount of light received by each light sensitive element in said array, and said method further comprising the step of selectively removing portions of said barrier material layer above said substrate at a region corresponding to said formed insulator material structure at each pixel.

17. The method as claimed in claim 16, wherein said step of forming Cu metal wire structure of each Cu metallization level includes:

applying a mask over an underlying interlevel dielectric layer, said mask patterned to open up trenches in between said pixel locations in said underlying dielectric layer;

conducting an etch process to open up said trenches at said locations; and depositing Cu metal in said trenches to form said metal wire structures.

18. The method as claimed in claim 17, wherein said step of depositing Cu metal in said trenches further includes lining said trench with a Cu diffusion barrier material.

19. The method as claimed in claim 17, further comprising the step of forming a barrier material layer on top each said Cu metal wire structure, said forming including implementing a self-aligned process to deposit said barrier material layer on top each formed said Cu metal wire structure of said metal interconnect layer.

20. The method as claimed in claim 19, wherein said step of implementing a self-aligned process to deposit a barrier material on top each said Cu metal wire structure further comprises performing an electroless plating process.

21. The method as claimed in claim 16, further comprising the steps of:

forming a barrier material layer on top said Cu metal wire structures of said metal interconnect layer by blanket depositing a thin barrier material layer atop said Cu metal wire structures including its respective underlying interlevel dielectric layer, wherein portions of said blanket deposited thin barrier material layer traverses an optical path of each array pixel.

22. The method as claimed in claim 21, further including the step of selectively removing portions of said thin barrier material layer at regions in line with an optical path of each pixel of said array.

23. The method as claimed in claim 22, wherein said step of selectively removing portions of said thin barrier material layer at regions in line with an optical path comprises, after blanket depositing said thin barrier material layer at each metallization level, the steps of applying a mask structure lithographically patterned to open up regions of said barrier material layer at locations traversing said optical path of each pixel; and conducting an etch process to remove the thin barrier material layer at said regions.

* * * * *